(12) United States Patent
Liang et al.

(10) Patent No.: US 7,390,976 B2
(45) Date of Patent: Jun. 24, 2008

(54) PROVIDING AIRFLOW TO AN ELECTRONICS ENCLOSURE WHILE PROVIDING PROTECTION AND SHIELDING AGAINST ELECTROMAGNETIC INTERFERENCE

(75) Inventors: Hsing-Sheng Liang, San Jose, CA (US);
Phillip S. Ting, San Jose, CA (US); Jim C. Chiappe, Walnut Creek, CA (US)

(73) Assignee: Cisco Technology, Inc., San Jose, CA (US)

( * ) Notice: Subject to any disclaimer, the term of this patent is extended or adjusted under 35 U.S.C. 154(b) by 43 days.

(21) Appl. No.: 11/454,396

(22) Filed: Jun. 16, 2006

(65) Prior Publication Data
US 2007/0289776 A1    Dec. 20, 2007

(51) Int. Cl.
*H05K 9/00*    (2006.01)
*H02B 1/56*    (2006.01)

(52) U.S. Cl. .................. 174/383; 174/394; 174/386; 361/816; 361/693; 454/184

(58) Field of Classification Search ................ 174/385, 174/383, 394, 386; 361/816, 818, 693; 454/184
See application file for complete search history.

(56) References Cited

U.S. PATENT DOCUMENTS 5,698,818 A * 12/1997 Brench ..................... 174/385

* cited by examiner

*Primary Examiner*—Hung V Ngo
(74) *Attorney, Agent, or Firm*—Peggy A. Su

(57) ABSTRACT

Methods and apparatus for shielding an object from relative high electromagnetic radio frequencies while allowing airflow to pass to and from the object are disclosed. According to one aspect of the present invention, a shield arrangement that shields a chassis includes at least a first plane and a second plane. The first plane has a thickness and defines a first plurality of openings that include a first opening and a second opening that are separated by at least a distance that is a function of the thickness. The second plane defines at least a third opening, and is approximately parallel to the first plane. The second plane is spaced apart from the first plane by a spacing that is a function of at least the thickness.

20 Claims, 7 Drawing Sheets

PROVIDING AIRFLOW TO AN ELECTRONICS ENCLOSURE WHILE PROVIDING PROTECTION AND SHIELDING AGAINST ELECTROMAGNETIC INTERFERENCE

BACKGROUND OF THE INVENTION

1. Field of Invention

The present invention relates generally to mechanical systems used to shield electronic equipment. More particularly, the present invention relates to a utilizing a plurality of parallel planes with staggered openings to provide protection against tampering and shielding to a chassis while maintaining a relatively large degree of airflow to the chassis.

2. Description of the Related Art

Forced convection is a widely used method to provide cooling to chassis that are associated with medium and high power electronic equipment. Chassis, or electronics enclosures, are primarily cooled through airflow. The amount of electromagnetic interference that may be contained, as well as design requirements specified by Federal Information Processing Standards (FIPS) to prevent tampering access to electronics circuitry, are often in contradiction with the forced convection, e.g., thermal, needs of a chassis.

In general, a plate that is positioned in proximity to an electronics enclosure shields the electronics enclosure, and is used both to reduce electromagnetic interference and to provide conformity with FIPS. Perforations or openings are typically included in the plate to allow for convection. The larger the openings in the plate are, the more airflow there is to and from the chassis. Hence, the efficiency with which the chassis may be cooled is higher when the openings are larger, and lower when the openings are smaller.

Although a plate with larger openings or, more generally, a plate with a relatively high surface area that is occupied by openings, is more efficient from a force convection standpoint, such a plate is less efficient from an electromagnetic compatibility standpoint. That is, as the percentage of open area on a plate increases, the amount of electromagnetic radio frequencies that may be contained decreases. As will be appreciated by those skilled in the art, electromagnetic radio frequencies or radiation must be at least partially contained to ensure electromagnetic compatibility. In addition, FIPS are less likely to be met when there is a relatively large percentage of open area on a plate. Designs generally achieve FIPS compliancy for a shielding plate using an array of relatively small openings, e.g., openings with an aperture of approximately 0.085 inches or less. While such designs may provide a reasonable amount of containment of electromagnetic radiation, such designs typically provide for an insufficient amount of airflow.

Therefore, what is needed is a method and an apparatus for protecting an electronics enclosure which meets FIPS, provides an acceptable amount of shielding relative to electromagnetic interference, and provides an acceptable amount of air flow. That is, what is desired is a system that effectively optimizes the amount of airflow available to cool a chassis, while providing a relatively high amount of shielding relative to electromagnetic interference and meeting FIPS.

SUMMARY OF THE INVENTION

The present invention relates to a shielding arrangement for an electronics enclosure that provides acceptable amounts of airflow and shielding for electromagnetic radio frequencies, while meeting design requirements specified by Federal Information Processing Standards (FIPS). According to one aspect of the present invention, a shield arrangement that shields an electronics enclosure includes at least a first plane and a second plane. The first plane has a thickness and defines a first plurality of openings that include a first opening and a second opening that are separated by at least a first distance. The second plane defines at least a third opening, and is approximately parallel to the first plane. The second plane is spaced apart from the first plane by a spacing that is a function of at least the first distance.

In one embodiment, the spacing is in a range between approximately 8 times the first distance and approximately 12 times the first distance. In another embodiment, the spacing is in a range between approximately 9 times the first distance and approximately 11 times the first distance.

The use of a shield arrangement with two or more planes that include webs which define openings allows electromagnetic shielding to be provided while allowing significant airflow through the shield arrangement. Further, a shield arrangement that include planes with overlapping holes or openings provides compliance with federal information processing standards FIPS. The planes in a shield arrangement may be of the same size and have openings of approximately the same size arranged in approximately the same layout pattern, e.g., the layout pattern of openings in one plane is staggered relative to the layout pattern of openings of another plane. A spacing between the planes is a function of the thickness of at least one of the planes, and may be adjusted to adjust the amount of airflow that may pass through the shield arrangement.

According to another aspect of the present invention, a system includes an electronics enclosure and a shield arrangement. The shield arrangement provides electromagnetic shielding for the electronics enclosure, and includes a plurality of planes. A first plane has a thickness and defines a first plurality of openings. A second plane includes a web that defines at least one opening and is spaced apart from the first plane by a spacing distance. The web inhibits lines-of-sight associated with the first plurality of openings. In one embodiment, the spacing distance is between approximately eight times and approximately twelve times the spacing distance.

In accordance with still another aspect of the present invention, a method for determining a spacing between a first plane and a second plane of a shielding arrangement includes defining, in a first plane, a first plurality of openings that includes a first opening and a second opening. Additionally, the first plane has a first distance measured between the first opening and the second opening. The method also includes aligning the first plane relative to the second plane such that a spacing between the first plane and the second plane is a function of the first distance. Finally, shielding characteristics associated with the shielding arrangement, which are a function of the spacing, are identified.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE EMBODIMENTS

Shields are often used to protect electronics equipment or circuitry contained in electronics enclosure. A shield may provide electromagnetic shielding and facilitate compliance with Federal Information Processing Standards (FIPS). Often, openings are included in a shield to allow airflow therethrough to cool a chassis protected by the shield. However, to substantially optimize airflow, electromagnetic shielding is often compromised, and vice versa.

A shield that uses two layers of perforated material may be aligned such that airflow requirements may be met, while electromagnetic shielding specifications for a system and FIPS standards are also met. The openings in a first layer may be positioned such that the openings in the first layer are staggered relative to the openings in a second layer to create a venting pattern. By separating the first layer and the second layer at a distance, a relatively high airflow recovery rate may be met, i.e., adequate airflow through the shield may be provided. The venting pattern may be arranged to meet electromagnetic shielding specifications and FIPS standards. For example, shielding electromagnetic radio frequencies of lower than approximately ten GigaHertz may be desired. As will be appreciated by those skilled in the art, an upper frequency for testing may depend upon precise customer and government agency requirements and internal clock frequencies inside a system. Some systems may utilize testing up to approximately 1 GigaHertz, while others may benefit from testing up to approximately 10 GigaHertz or up to approximately 40 GigaHertz. Often, a shielded enclosure for unintentional radiators may be such that 20 decibels occur at approximately the highest tested frequency.

Figure 1A:
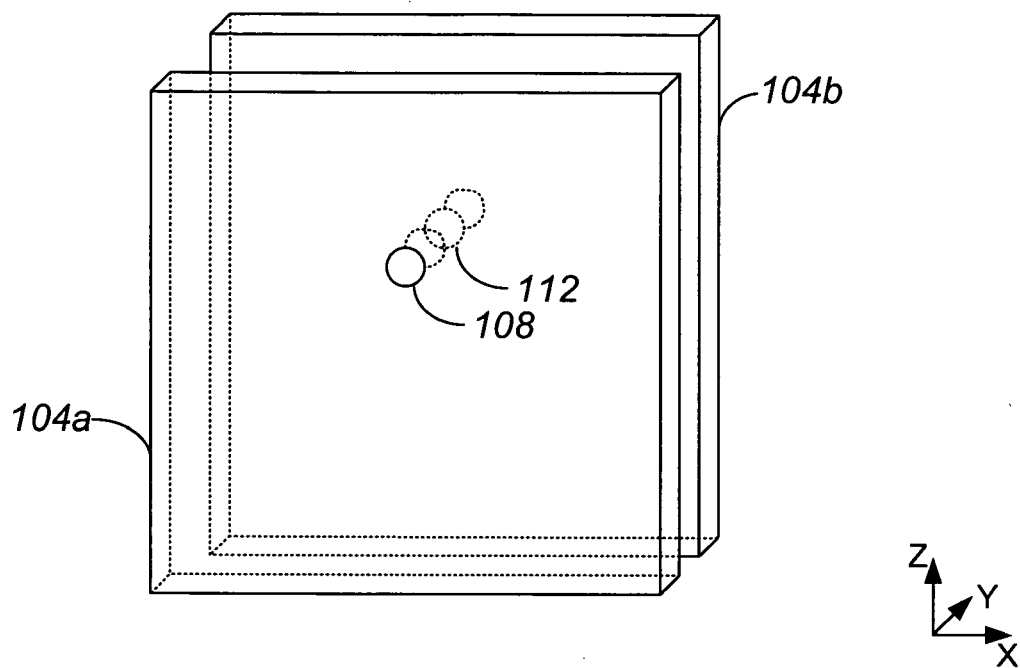
FIG. 1A is a diagrammatic representation of two planes with openings which are placed at a distance apart and are arranged to shield an electronics enclosure in accordance with an embodiment of the present invention.
Figure 1B:
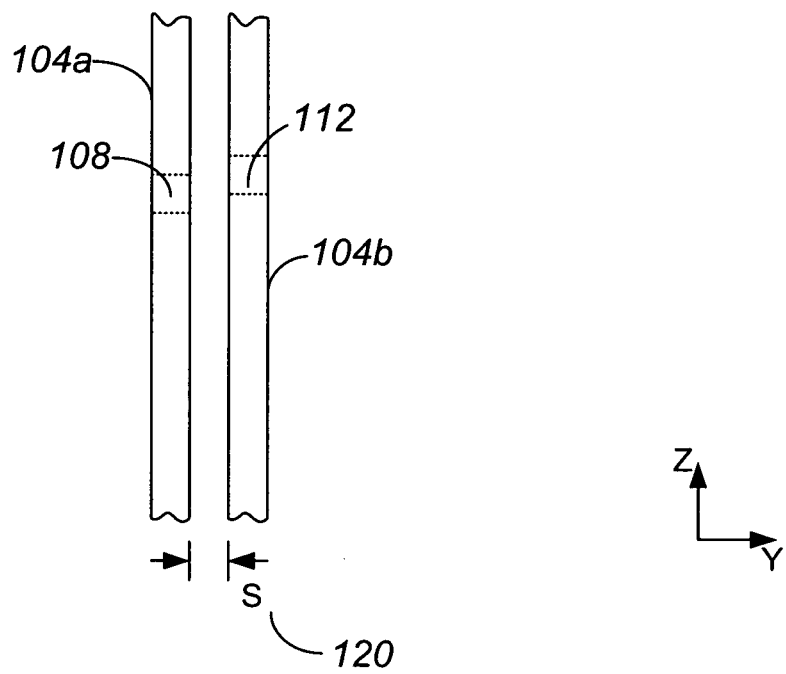
FIG. 1B is a diagrammatic cross-section side-view magnified representation of two planes, i.e., planes 104a and 104b of FIG. 1A, that are aligned with staggered openings in accordance with an embodiment of the present invention.

FIG. 1A is a diagrammatic representation of two layers or planes with openings which are placed at a distance apart and are arranged to shield an electronics enclosure in accordance with an embodiment of the present invention. Planes 104a, 104b are arranged to provide shielding to an electronics enclosure, e.g., a chassis in a rack that is arranged to contain electronics equipment, as will be described below with respect to FIG. 1C. Plane 104a includes at least one opening 108, and plane 104b includes at least one opening 112. It should be appreciated that planes 104a, 104b generally include multiple openings 108, 112, respectively. Opening 112 is positioned, in one embodiment, such that a portion of opening 112 effectively overlaps opening 108, as shown in FIG. 1B. That is, opening 112 is positioned such that only a part of opening 112 is effectively overlapped by opening 108. Similarly, opening 108 is aligned such that only a part of opening 108 is overlapped by opening 112. Such an alignment for openings 108, 112 allows for significant airflow through planes 104a, 104b, while providing shielding for electromagnetic radio frequencies or relatively high frequency radiation, and substantially preventing a barrier formed by planes 104a, 104b from being readily penetrated.

Although planes 104a, 104b are shown as being separate plates, planes 104a, 104b are not limited to being separate plates. By way of example, planes 104a, 104b may be part of a substantially single body that is arranged such that planes 104a, 104b are in a substantially parallel orientation. Such a single body may be bent to allow plane 104a to be approximately parallel to plane 104b. In one embodiment, planes 104a, 104b may be individual plates that are coupled together to effectively hold plane 104a in a position that is approximately parallel to plane 104b.

As shown in FIG. 1B, which is a cross-sectional side-view magnified representation of a portion of planes 104a, 104b, a spacing S 120 is maintained between planes 104a, 104b, which are arranged in a substantially parallel orientation. By substantially adjusting spacing S 120, the amount of airflow through planes 104a, 104b may be controlled. In one embodiment, spacing S 120 may be adjusted to provide an airflow recovery of approximately ninety percent or more. An airflow recovery rate is typically a function of dynamic pressure and real pressure, and may be expressed as follows:

$$\text{Airflow Recovery Rate} \equiv \frac{\left(\dfrac{P_{loss}}{\frac{1}{2}\rho V^2}\right)_{twoplaneswithseparation} - \left(\dfrac{P_{loss}}{\frac{1}{2}\rho V^2}\right)_{twoplaneswithnoseparation}}{\left(\dfrac{P_{loss}}{\frac{1}{2}\rho V^2}\right)_{oneplane} - \left(\dfrac{P_{loss}}{\frac{1}{2}\rho V^2}\right)_{twoplaneswithnoseparation}}$$

where $P_{loss}$ is a pressure loss, $\rho$ is the density of a fluid such as air, and V is a fluid velocity such as an airflow velocity.

Figure 1C:
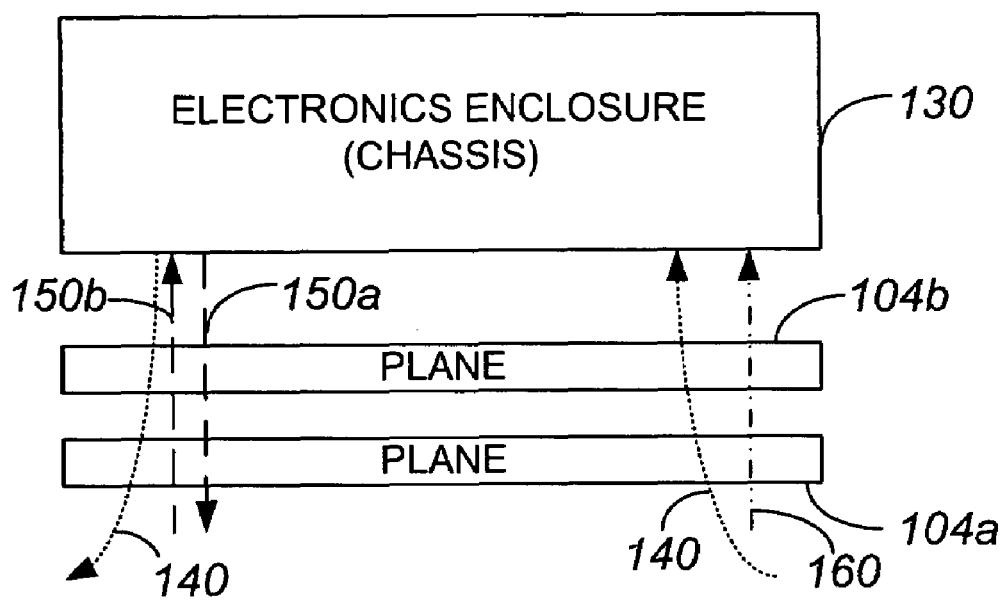
FIG. 1C is a block diagram representation of an electronics enclosure that is shielded by a plurality of perforated planes, e.g., planes 104a and 104b of FIG. 1A, in accordance with an embodiment of the present invention.

FIG. 1C is a block diagram representation of an electronics enclosure that may be shielded by plane 140a, 140b of FIGS. 1A and 1B in accordance with an embodiment of the present invention. An electronics enclosure 130 that is shielded by planes 104a, 104b may contain electronics equipment or other equipment that generates at least one of heat or electromagnetic radiation during operation. Electronics enclosure 130 and the electronics equipment contained therein, typically form an overall electronics system. In some instances, planes 104a, 104b may also be considered to be a part of an overall electronics system. Airflow 140 may circulate through openings, e.g., openings 108, 112 as shown in FIGS. 1A and 1B, in planes 104a, 104b to provide forced convection and, hence, thermal cooling to electronics enclosure 130. The amount of outgoing electromagnetic radiation 150a that passes from chassis may be inhibited by planes 104a, 104b, while the amount of incoming electromagnetic radiation 150b that passes to electronics enclosure 130, e.g., electromagnetic radiation generated by a nearby electronic system, may be inhibited by planes 104a, 104b. The inhibiting of electromagnetic radiation 150a, 150b may be achieved due to the relatively low percentage of area of each plane 104a, 104b that is open. The relatively low percentage of area of each plane 104a, 104b that is open, in conjunction with the alignment of openings in planes 104a, 104b such that part of each opening in plane 104a is obscured by plane 104b, and vice versa, allows some FIPS design requirements to be met. In one embodiment, the percentage of each plane 104a, 104b that is open, e.g., composed of openings, may be less than approximately fifty percent.

Figure 2:
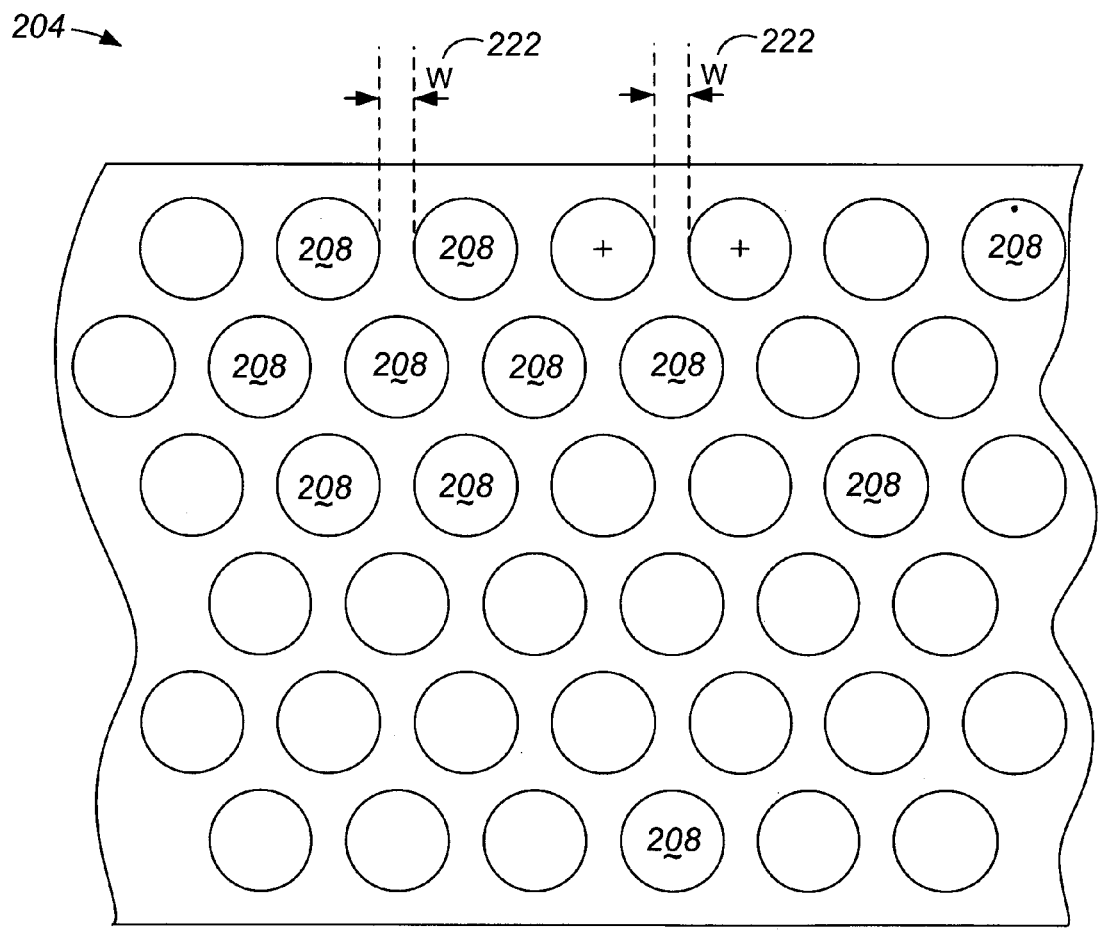
FIG. 2 is a diagrammatic representation of a section of a perforated plane in accordance with an embodiment of the present invention.

As mentioned above, a plane typically includes multiple openings. FIG. 2 is a diagrammatic representation of a section of a plane that includes multiple openings in accordance with an embodiment of the present invention. A portion 204 of a plane e.g., a perforated plane, includes multiple openings 208. Openings 208 may be approximately circular in shape, and the diameter of openings 208 may vary widely. The diameter of openings 208 may vary widely depending upon a number of different factors which include, but are not limited to, the thickness of plane 204 and the percentage of open area desired in portion 204. In one embodiment, openings 208 may be between approximately 0.1 and approximately 0.2 inches in diameter, e.g., approximately 0.14 inches in diameter.

Typically, as the diameter of openings 208 increases, a web size, i.e., a web distance W 222, increases. Distance W 222 is a distance between the nearest edges of openings 208 that are in the same row, and may be dependent upon the thickness of the material from which portion 204 of plane is formed. In the embodiment as shown, distance W 222 is a minimum distance between adjacent openings 208. As will be discussed below with reference to FIGS. 4A and 4B, a spacing between two planes 204 that provides a relatively high amount of airflow while providing a relatively high amount of electromagnetic shielding is dependent upon distance W 222.

The material from which a plane is formed may vary widely. In general, a plane may be formed from substantially any material that is relatively stiff or rigid, as well as relatively easy to machine. By way of example, a plane may be formed from a material such as metal, metalized plastic, or metal coated plastic.

Openings 208 are arranged, in one embodiment, such that each opening 208 that is not at an edge of portion 204 is arranged to have six neighboring openings 208. More specifically, each opening 208 within portion 204 that is not located at an edge of portion 204 has a center that is approximately equidistant to the centers of each neighboring opening 208.

Figure 3A:
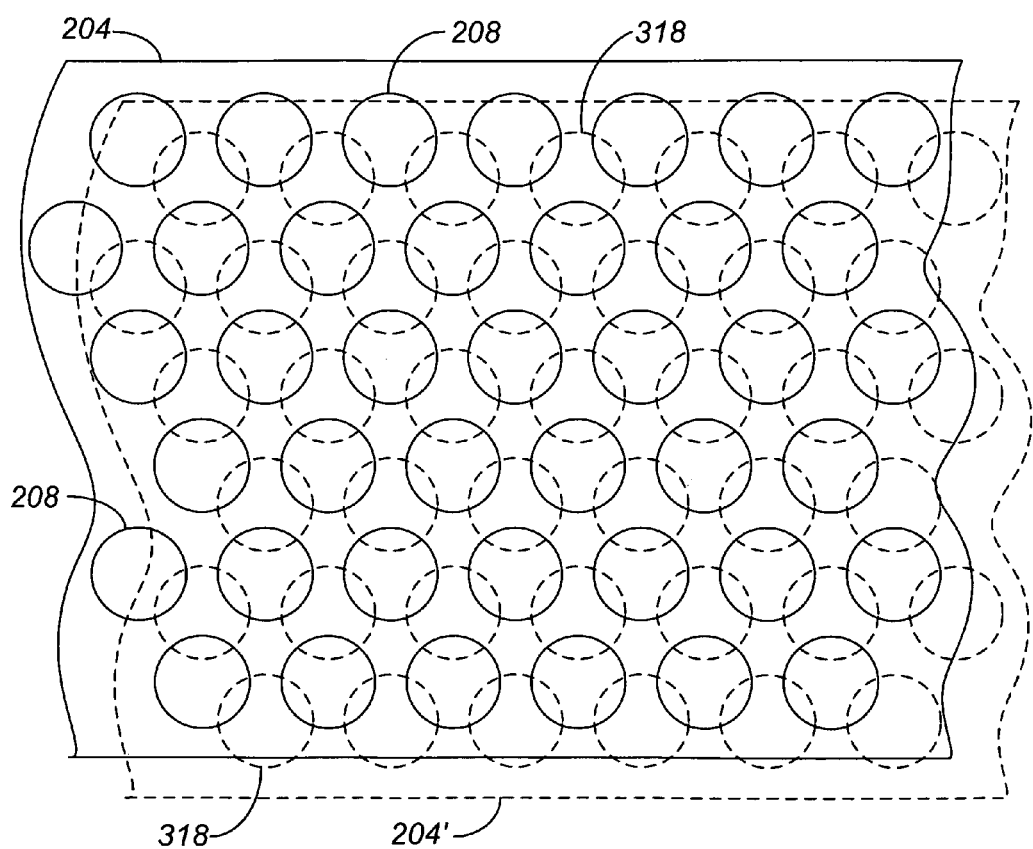
FIG. 3A is a diagrammatic representation of two perforated planes arranged one in front of the other such that openings are in a substantially staggered orientation in accordance with an embodiment of the present invention.

Two planes 204 may be aligned such that openings 208 in the two planes 204 are staggered. With reference to FIG. 3A, the alignment of two planes with approximately identical hole or opening patterns in a stacked shield arrangement will be described in accordance with an embodiment of the present invention. Portion 204 of a plane may be aligned with a portion 204' of another plane. Openings 208 in portion 204 are approximately the same size as openings 318 in portion 204', and are aligned in approximately the same pattern.

Figure 3B:
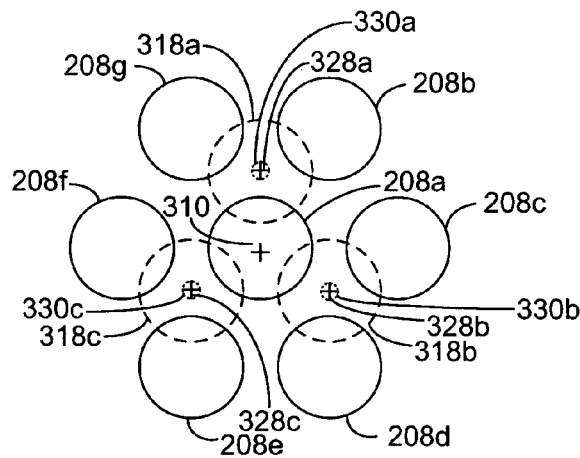
FIG. 3B is a diagrammatic representation of a staggered orientation for openings associated with two perforated planes, e.g., openings 208 and 318 of FIG. 3A, in accordance with an embodiment of the present invention.

Openings 208 are aligned with openings 318 such that each opening 208 that is not at an edge of portion 204 is partially blocked, but overlapped by three openings 318 of portion 204'. In other words, the line-of-sight through each non-edge openings 208 of portion 204 is three openings 318. As shown in more detail in FIG. 3B, an opening 208a with an approximate center point 310 has six neighboring openings 208b-g. Openings 318a-b, which are part of portion 204' of a different plane than openings 208a-g, are each positioned to be centered relative to a point 328a-c that is approximately equidistant from neighboring openings 208a-g. By way of example, opening 318a has an approximate center 330a that substantially coincides with point 328a, and point 328a is approximately equidistant from center point 310 of opening 208a and center points (not shown) of openings 208b, 208g.

Figure 3C:
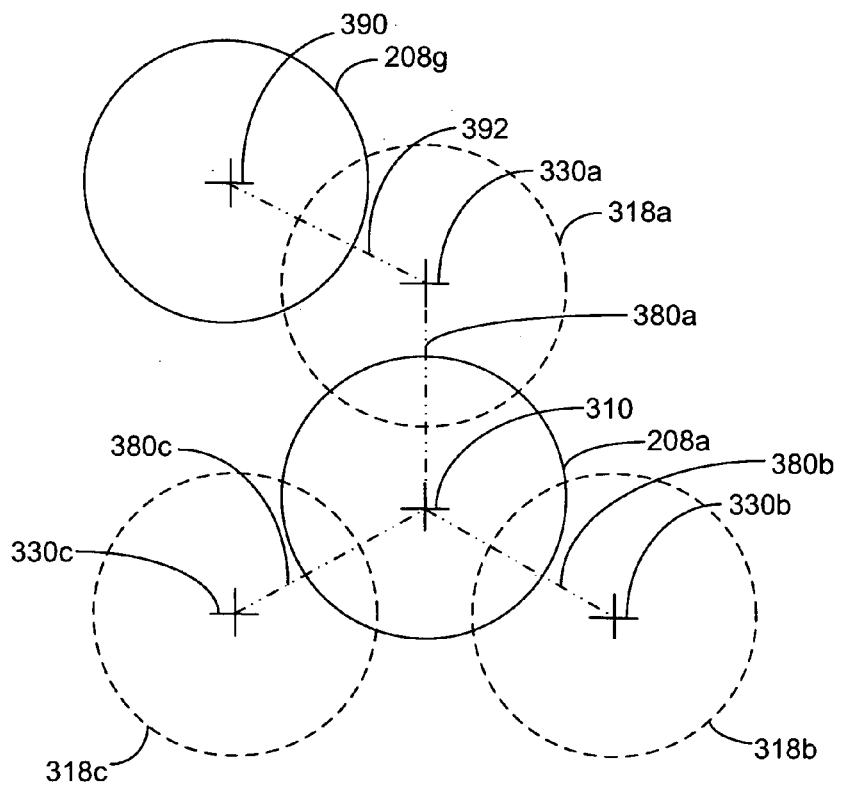
FIG. 3C is a diagrammatic magnified representation of a staggered orientation for openings associated with two perforated planes, e.g., openings 208a, 208g, and 318a-c of FIG. 3B, in accordance with an embodiment of the present invention

As shown in more detail in FIG. 3C, opening 208a is partially overlapped by openings 318a-c such that center point 310 of opening 208a is at a distance 380a from approximate center 330a of openings 318a. Distance 380a is approximately equal to a distance 380b, which is measured between center point 310 and approximate center 330b of opening 318b, and to a distance 380c, which is measured between center point 310 and approximate center 330c of opening 318c. Further, a distance 392 that is measured between approximate center 330a and a center point 390 of opening 208g is also approximately equal to distance 380a.

The approximately minimum distances between adjacent openings of a plane, e.g., web distance W 222 of FIG. 2, may vary depending upon a thickness of the plane, in one embodiment. That is, a distance between adjacent openings in a plane may be a function of the thickness of the plane. As will be appreciated by those skilled in the art, the thickness of a plane is typically determined by the rigidity needed to prevent flexing of the plane and to allow the plane to be efficiently fabricated. The thickness of a plane may also be a function of the overall length and width of the plane. In one embodiment, the thickness of a plane may be between approximately 0.04 inches and approximately 0.05 inches, e.g., approximately 0.048 inches. The thickness of a plane, however, may vary widely.

Figure 4A:
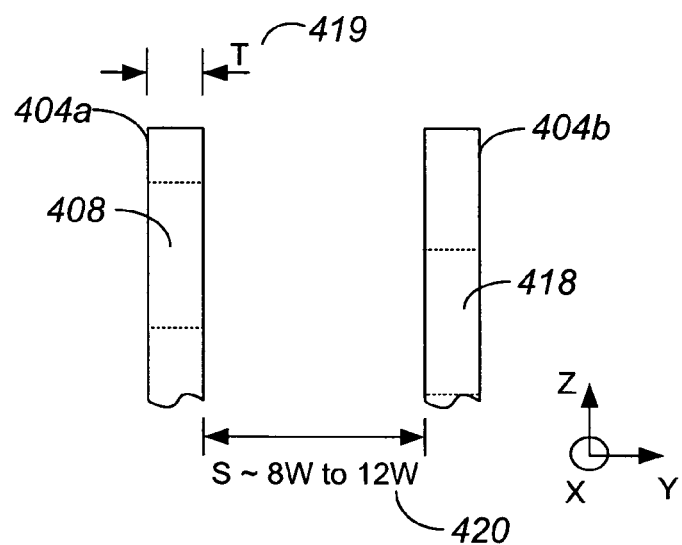
FIG. 4A is a diagrammatic side-view representation of portions of two perforated planes of a thickness T that are offset at a distance S in accordance with an embodiment of the present invention.
Figure 4B:
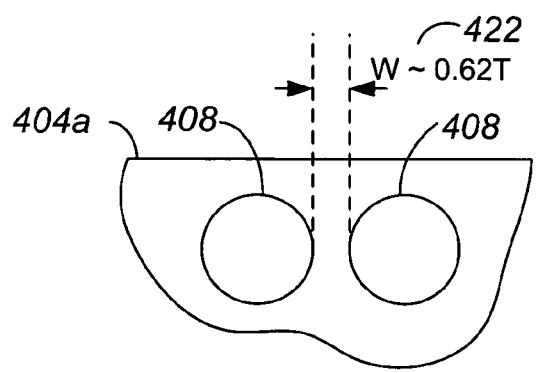
FIG. 4B is a diagrammatic front view representation of a portion of a perforated plane, e.g., perforated plane 404a of FIG. 4A, in accordance with an embodiment of the present invention.

With reference to FIGS. 4A and 4B, the dimensions associated with a plurality of perforated planes will be described in accordance with an embodiment of the present invention. FIG. 4A is a diagrammatic side-view representation of portions of a plurality of perforated planes, and FIG. 4B is a diagrammatic front view representation of a portion of a perforated plane, e.g., perforated plane 404a of FIG. 4A. A first plane 404a with at least one opening 408 has a thickness T 419, and is oriented substantially parallel to a second plane 404b with at least one opening 418. Although planes 404a, 404b generally have approximately the same thickness, the thickness of plane 404b may be different from thickness T 419.

A spacing S 420 between plane 404a and plane 404b may have a value between approximately may be between approximately eight times distance W 422 and approximately twelve times distance W 422. It should be appreciated that spacing S 420 may also be dependent on factors such as thickness T 419. By way of example, spacing S 420 may be dependent on both thickness T 419 and a diameter associated with openings 408. A distance W 422, or an approximately minimum distance between adjacent openings 408 of plane 404a, may be approximately 0.62 T or, more generally, less than approximately T. In general, distance W 422 may be specified as being less than approximately equal to thickness T 419. However, it should be appreciated that spacing S 420 may be a value between approximately eight times distance W 422 and approximately twelve times distance W 422 regardless of any relationship between distance W 422 and thickness T 419, i.e., spacing S 420 and distance W 422 may be independent of thickness T 419.

A designer of a shield may specify a thickness of a plane, a size and orientation of openings of the plane, and a web thickness of the plane. With the plane that meets specifications of the designer, and at least one other plane which may or may not be the same as the plane that meets specifications, the designer may determine a suitable spacing between the planes. In one embodiment, a spacing between the planes may be chosen to effectively maximize an amount of airflow through the planes, while providing an adequate amount of shielding for electromagnetic interference and meeting FIPS requirements, e.g., FIPS 140-2 standards. That is, a substantially optimal spacing between a plurality of planes may be determined such that a best combination of airflow, shielding for electromagnetic interference, and meeting FIPS requirements for a given shield may be achieved.

Figure 5:
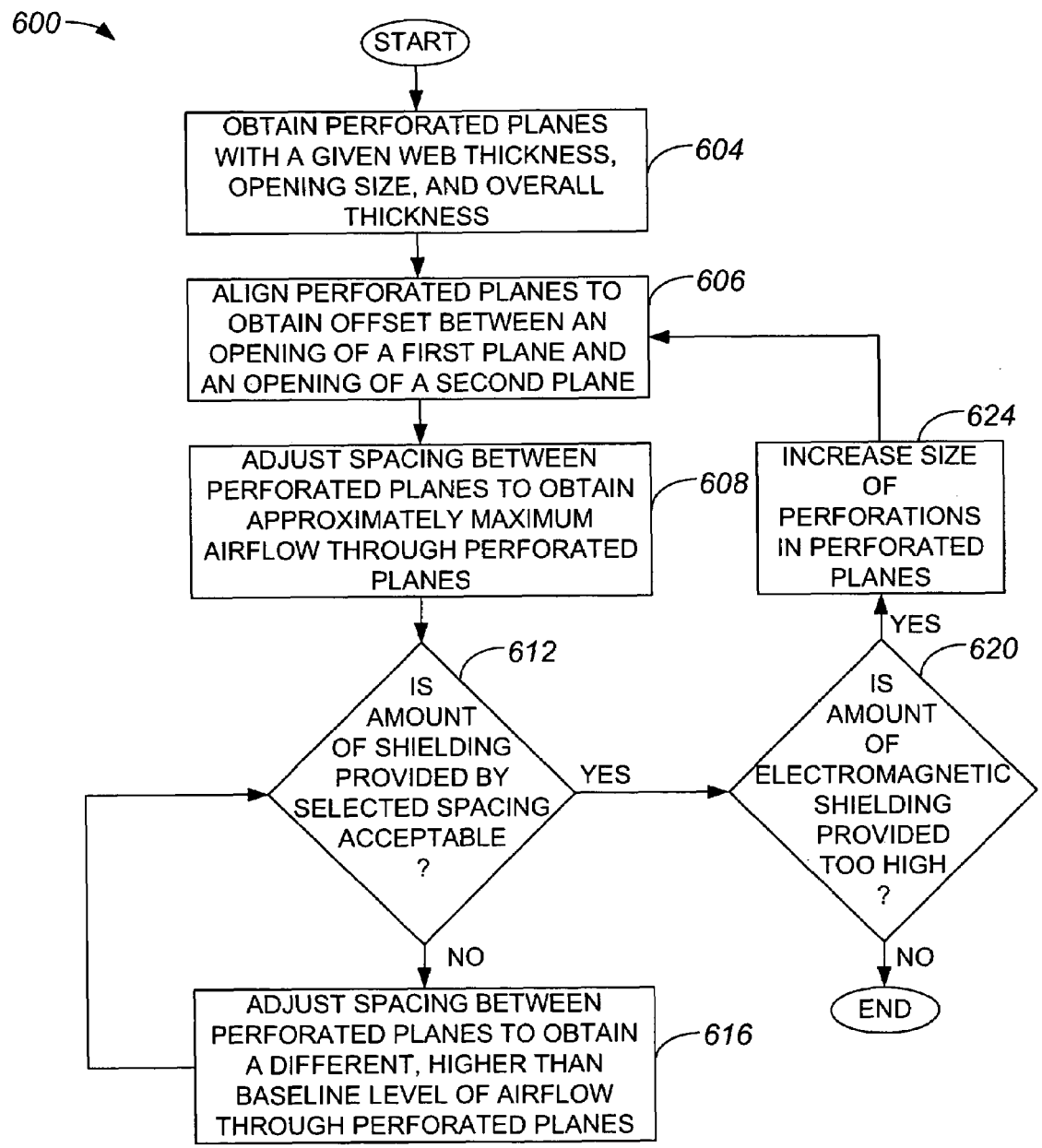
FIG. 5 is a process flow diagram which illustrates one method of adjusting the spacing between a plurality of perforated planes to provide an acceptable amount of airflow and shielding against electromagnetic interference in accordance with an embodiment of the present invention.

With reference to FIG. 5, a method of determining a suitable spacing between a plurality of planes used to shield a chassis will be described in accordance with an embodiment of the present invention. A process 600 of determining a suitable spacing between planes begins at step 604 in which perforated planes are obtained. The perforated planes have a given thickness, web thickness, opening size or sizes, and orientation of openings. In one embodiment, the orientation of openings on one plane relative to the orientation of openings on another plane may be arranged to meet FIPS standards.

Once perforated planes are obtained, the perforated planes are aligned to obtain a particular offset between an opening of a first plane and an opening of a second plane in step 606. The offset may be such that distances between a center of the opening of the first plane and the centers of openings of the second plane that partially overlap the opening of the first plane to create a line-of-sight through the opening of the first plane are approximately the same, as described above with respect to FIG. 3C. That is, the first and second planes are aligned so that the offset between the opening of the first plane and the opening of the second plane is a predetermined value.

After the first plane and the second plane are aligned relative to each other, the spacing between the planes is adjusted to obtain an approximately maximum level of airflow therethrough in step 608. Adjusting the spacing between the planes may include empirically or experimentally determining a spacing at which at least an approximately maximum level of airflow is achieved. The maximum level of airflow generally exceeds a baseline level of airflow. The baseline level of airflow may be the airflow through a shield when only two planes with approximately no spacing therebetween, e.g., two of the perforated planes obtained in step 604 used with no spacing therebetween, is used in the shield.

A determination is made in step 612 regarding whether the amount of shielding, e.g., shielding from electromagnetic interference and shielding from line-of-sight access, provided by the selected spacing is acceptable. In other words, it is determined if the spacing selected between the first and second planes provides at least adequate shielding of electromagnetic radiation in a particular frequency range and adequate shielding from line-of-sight access. Shielding may be determined through running a simulation on a computing device or taking experimental measurements.

If it is determined that adequate shielding is afforded with the spacing, process flow moves to step 620 in which it is determined if the amount of shielding from electromagnetic interference is effectively too high. When an amount of shielding from electromagnetic interference exceeds an acceptable level by a relatively high amount, then the indication is that more airflow may be provided through the first and second planes while still providing an adequate amount of shielding from electromagnetic interference. As such, if the amount of shielding form electromagnetic interference is effectively too high, then the size of the perforations, or holes, in the first and second planes is increased in step 624. Increasing the size of the perforations provides additional airflow through the planes. After the size of the perforations is increased, process flow returns to step 606 in which the first and second planes are aligned. Alternatively, if it is determined in step 620 that the amount of electromagnetic shielding provided by the first and second planes is not effectively too high, the process of determining a suitable spacing between perforated planes is completed.

Returning to step 612, if it is determined that the amount of shielding provided by the first plane and the second plane at the selected spacing is not acceptable, the indication is that a spacing that provides a lower level of airflow that that provided by the selected spacing is to be attempted. Accordingly, in step 616, the spacing between the first plane and the second plane is adjusted. In one embodiment, the adjustment of the spacing between the first plane and the second plane is such that an airflow level that exceeds a baseline level is still achieved. From step 616, process flow returns to step 612 in which it is determined whether the amount of shielding provided by the current or selected spacing is acceptable.

Although only a few embodiments of the present invention have been described, it should be understood that the present invention may be embodied in many other specific forms without departing from the spirit or the scope of the present invention. By way of example, a plurality of perforated planes has been described as being suitable for use in achieving a relatively high level of airflow while provided shielding from electromagnetic radiation and meeting FIPS standards. However, the plurality of perforated planes may be implemented to meet any combination of airflow requirements, shielding specifications, and FIPS standards.

In some instances, electromagnetic shielding specifications and FIPS standards may be such that visibility to an electronics enclosure protected by a shield is to be reduced to approximately zero. That is, specifications may be such that no line-of-sight vision into a chassis is permissible. To provide no line-of-sight, openings in planes may be staggered such that no openings of a first plane overlap any openings of a second plane. It should be appreciated that spacing between the first plane and the second plane may be selected such that even with no line-of-sight through the shield, adequate airflow and, hence, cooling may be achieved.

Airflow requirements or a desired amount of airflow may vary widely. In one embodiment, an airflow recovery of approximately ninety percent may be desired. That is, it may be desired that at least approximately ninety percent of the airflow through a first plate passes through a second plate. Similarly, electromagnetic shielding requirements and FIPS requirements may also vary widely. For instance, shielding electromagnetic interference that is of a frequency lower than approximately ten GigaHertz may be desired, and FIPS requirements to be met may be met by meeting FIPS 140-2 standards.

To reduce resonance in an assembly that includes a plurality of perforated planes, absorbers may be introduced. In other words, to reduce increase the electromagnetic shielding effectiveness associated with a plurality of perforated planes, absorbers such as ferrite absorbers may be used in an assembly that includes perforated planes.

While an electronics enclosure or a chassis or, more generally, an overall electronics system, has been described as being shielded by a plurality of perforated planes with staggered openings, it should be appreciated that perforated planes with staggered openings may shield substantially any framework that benefits from being shielded. That is, substantially any framework that supports electronics equipment supports other equipment that generates electromagnetic radiation, or supports other equipment that generates heat may be shielded using perforated planes that have staggered openings.

The size of openings in a plane may vary widely. More generally, the percentage of open space in a plane may vary. In addition, the alignment of holes of a plane, and the alignment of holes of a plane relative to holes of a parallel plane, may vary widely. For example, although parallel planes have been described as being aligned such that holes in one plane partially overlap holes in the other plane, each plane may have open areas that occupy less than an approximately fifty percent of the plane. In such a case, the holes of the planes may be aligned such that no line-of-sight access to a chassis protected by the planes is possible.

Further, openings in a plane have been described as generally having approximately six neighboring openings. The number of neighboring openings to any particular opening, however, may vary widely. For instance, any given opening in a plane may be neighbored by fewer than six or more than six openings. The distance between each opening and its neighboring openings may also vary, e.g., the distance from an approximate center point of an opening to an approximate center point of one neighboring opening may differ from the distance from the approximate center point of the openings to an approximate center point of another neighboring opening.

The dimensions associated with perforated planes may vary. By way of example, spacing between approximately parallel planes may be less than approximately eight times the web distance of a plane or more than approximately twelve times the web distance of the plane without departing from the spirit or the scope of the present invention. In addition, a web size or distance of a plane may be less than approximately 0.6 times or more than approximately 0.7 times the thickness of the plane.

While openings in a perforated plane have generally been described as being circular, openings may take a variety of different shapes without departing from the spirit or the scope of the present invention. Further, openings in a perforated plane may not be of approximately the same size and shape, i.e., openings of different sizes and openings of different shapes may be included in a perforated plane.

The planes that are effectively stacked together to form a shield may be approximately identical. However, planes that are effectively stacked together to form a shield are not limited to being approximately identical. In other words, planes that are spaced at a specified distance apart to form a shield may not necessarily be approximately identical.

Planes have been described as being approximately parallel to one another, although the planes are not limited to being approximately parallel to one another. Further, the two or more planes may be utilized to shield a chassis. In one embodiment, if there are more than two planes, the orientation and size of openings in each of the planes is not necessarily the same. That is, a pattern of openings for each plane of a shield with more than two planes is may be different. Planes may also be formed as separate plates, or as a single plate that is bent or folded to create at least two planes that are substantially parallel to one another.

The steps associated with the methods of the present invention may vary widely. Steps may be added, removed, altered, combined, and reordered without departing from the spirit of the scope of the present invention. By way of example, if a level of shielding associated with a particular spacing between two planes is determined to not be acceptable because there are resonances in a frequency range that is to be shielded, an absorber may be added between the two planes. Once an absorber is added, it may be determined once again whether a level of shielding is acceptable. In other words, before readjusting spacing between two planes, an absorber may first be added between the two planes to assess whether the absorbers improve the level of shielding. Therefore, the present examples are to be considered as illustrative and not restrictive, and the invention is not to be limited to the details given herein, but may be modified within the scope of the appended claims.

What is claimed is:

1. A shield arrangement, the shield arrangement being arranged to provide shielding to an electronics enclosure, the shield arrangement comprising:
   a first plane, the first plane having a thickness and defining a first plurality of openings, the first plurality of openings including a first opening and a second opening, wherein the first opening and the second opening are separated by at least a distance; and
   a second plane, the second plane defining at least a third opening, wherein the second plane is arranged to be approximately parallel to the first plane and is spaced apart from the first plane by a spacing that is a function of at least the distance.

2. The shield arrangement of claim 1 wherein the third opening is arranged to at least partially overlap the first opening.

3. The shield arrangement of claim 2 wherein the first plurality of openings includes a fourth opening, the first opening, the second opening, and the fourth opening each having an associated center, and wherein the third opening has an approximate center that is approximately equidistant from the associated center of the first opening, the associated center of the second opening, and the associated center of the fourth opening.

4. The shield arrangement of claim 1 wherein the spacing is in a range between approximately 8 times the distance and approximately 12 times the distance.

5. The shield arrangement of claim 1 wherein the distance is in a range between approximately 0.6 times the thickness and approximately 0.7 times the thickness.

6. The shield arrangement of claim 1 wherein the first plane is a first metal plate and the second plane is a second metal plate.

7. The shield arrangement of claim 1 wherein the distance is a function of the thickness.

8. The shield arrangement of claim 1 wherein the first opening, the second opening, and the third opening are each approximately circular and each have a diameter in the range between approximately 0.1 inches and approximately 0.2 inches.

9. A method for determining a spacing between a first plane and a second plane, the first plane and the second plane being associated with a shielding arrangement, the method comprising:
defining, in a first plane, a first plurality of openings, the first plurality of openings including a first opening and a second opening, the first plane further having a thickness and a first distance, wherein the first distance is measured between the first opening and the second opening;
aligning the first plane relative to a second plane, wherein a spacing between the first plane and the second plane is a function of the first distance; and
identifying shielding characteristics associated with the shielding arrangement, wherein the shielding characteristics are a function of the spacing.

10. The method of claim 9 further including:
determining if the shielding characteristics are acceptable; and
re-aligning the first plane relative to the second plane to define a new spacing between the first plane and the second plane as a function of the first distance if it is determined that the shielding characteristics are not acceptable.

11. The method of claim 9 wherein the spacing is in the range between approximately 8 times the first distance and approximately 12 times the first distance.

12. The method of claim 9 wherein the second plane defines a third opening, a fourth opening, and a fifth opening, and aligning the first plane relative to the second plane includes:
positioning an approximate center of the third opening at a second distance from an approximate center of the first opening;
aligning an approximate center of the fourth opening at a third distance from the approximate center of the first opening; and
aligning an approximate center of the fifth opening at a fourth distance from the approximate center of the first opening, wherein the second distance, the third distance, and the fourth distance are approximately equal.

13. The method of claim 12 wherein the third opening, the fourth opening, and the fifth opening each overlap at least a portion of the first opening.

14. The method of claim 9 wherein the distance is in the range between approximately 0.6 times the thickness and approximately 0.7 times the thickness.

15. An apparatus comprising:
means for providing a first set of openings, the first set of openings including a first opening and a second opening, wherein the first opening and the second opening are spaced apart along a first axis by at least a first distance; and
means for providing a second set of openings, the second set of openings being positioned apart from the first set of openings along a second axis by a spacing, wherein the spacing is a function of the first distance.

16. The apparatus of claim 15 wherein the means for providing the second set of openings is arranged to at least partially obscure the first opening and the second opening.

17. A system comprising:
an electronics enclosure; and
a shield arrangement, the shield arrangement being arranged to provide electromagnetic shielding for the electronics enclosure, the shield arrangement including a first plane and a second plane, the first plane having a thickness, the first plane further being arranged to define a first plurality of openings, the second plane having a web that defines at least one opening, the web being arranged to inhibit lines-of-sight through the first plurality of openings, wherein the first plane is spaced apart from the second plane by a spacing distance that is a function of the thickness.

18. The system of claim 17 wherein the spacing distance is in a range between approximately five times the thickness and approximately nine times the thickness.

19. The system of claim 17 wherein the first plurality of openings and the second plurality of openings are arranged to include openings of approximately a same size.

20. The system of claim 19 wherein a spacing between adjacent openings of the first set of openings is approximately the same as a spacing between adjacent openings of the second set of openings.

* * * * *